United States Patent
Yukawa et al.

[19]

[11] Patent Number: 6,144,232
[45] Date of Patent: Nov. 7, 2000

[54] CHOPPER TYPE VOLTAGE COMPARING CIRCUIT CAPABLE OF CORRECTLY DETERMINING OUTPUT POLARITY, AND VOLTAGE COMPARING METHOD

[75] Inventors: Akira Yukawa, Tokyo; Toshio Ohkido, Kanagawa, both of Japan

[73] Assignee: NEC Corporation, Tokyo, Japan

[21] Appl. No.: 09/256,293

[22] Filed: Feb. 24, 1999

[30] Foreign Application Priority Data

Feb. 27, 1998 [JP] Japan .................................. 10-047598

[51] Int. Cl.⁷ ............................. H03K 5/22; H03K 5/153
[52] U.S. Cl. .............................................. 327/77; 327/337
[58] Field of Search ................................. 327/77, 91, 93, 327/94, 95, 96, 337; 330/9, 51

[56] References Cited

U.S. PATENT DOCUMENTS 5,821,780  10/1998  Hasegawa .................................. 327/63
6,046,612   4/2000  Taft .......................................... 327/77

FOREIGN PATENT DOCUMENTS 61-200715  9/1986  Japan .
9-83316    3/1997  Japan .

*Primary Examiner*—Toan Tran
*Assistant Examiner*—Paul Dinh
*Attorney, Agent, or Firm*—McGinn & Gibb, P.C.

[57] ABSTRACT

A highspeed voltage comparing operation by a voltage comparing circuit is realized while input sampling timing can be made constant. This voltage comparing circuit is mainly arranged by a first switch, a second switch, a third switch, a fourth switch, a fifth switch, a sixth switch, a seventh switch, a eighth switch, a first capacitor, a second capacitor, a first inverter, a second inverter, a third capacitor, and a fourth capacitor. In this voltage comparing circuit, an input signal voltage is held in the first capacitor and also a reference voltage is held in the second capacitor in an input sampling mode. Then, electron charges stored in these capacitors are redistributed, and the difference voltage between the input voltage and the reference voltage is amplified by two sets of inverters in an amplifying mode. In a latch mode, these first and second inverters are operated as a flip-flop circuit. Consequently, in this voltage comparing circuit, the sampling timing of the input voltages can be correctly and periodically determined, so that the precision of the input signal comparing process operation can be improved.

30 Claims, 10 Drawing Sheets

CHOPPER TYPE VOLTAGE COMPARING CIRCUIT CAPABLE OF CORRECTLY DETERMINING OUTPUT POLARITY, AND VOLTAGE COMPARING METHOD

BACKGROUND OF THE INVENTION

1. Field of the Invention

The present invention generally relates to an inverter chopper type balance/unbalance-mode voltage comparing circuit and also a voltage comparing method. More specifically, the present invention is directed to a chopper type voltage comparing circuit with employment of an inverter, capable of periodically, correctly determining a polarity of a comparison output based upon a comparison result of input voltages, and further to a voltage comparing method.

2. Description of the Related Art

Chopper type voltage comparing circuits are useful in highspeed analog-to-digital (A/D) converters and the like. Conventionally, one typical chopper type voltage comparing circuit is known from, for example, Japanese Patent Laid-open Application No. Sho61-200715 published in 1986. That is, in this conventional chopper type voltage comparing circuit, two sets of inverters are connected via the capacitor in the forward feedback manner, so that the voltage comparison can be carried out while maintaining a small offset value and a high sensitivity.

FIG. 9 is a circuit diagram for indicating an electronic circuit arrangement of one conventional voltage comparing circuit. FIG. 10 is a diagram for representing operation timing in this conventional voltage comparing circuit. FIG. 11 graphically shows a transfer characteristic of an inverter.

As indicated in FIG. 9, the conventional voltage comparing circuit is mainly arranged by a switch 101, another switch 102, another switch 103, another switch 104, another switch 105, another switch 106, another switch 107, another switch 108, a capacitor 110, another capacitor 111, an inverter 112, another inverter 113, another capacitor 114, another capacitor 115, a current source circuit 116, another current source circuit 117, another current source circuit 118, and a further current source circuit 119.

In this conventional voltage comparing circuit, the switch 101 is turned ON/OFF between a plus-sided voltage $V_{I+}$ of an analog input signal and one terminal of the capacitor 110. The switch 102 is turned ON/OFF between a minus-sided voltage $V_{I-}$ of the analog input signal and one terminal of the capacitor 111. The switch 103 is turned ON/OFF between a plus-sided voltage $V_{R+}$ of a reference voltage and one terminal of the capacitor 110. The switch 104 is turned ON/OFF between a minus-sided voltage $V_{R-}$ of the reference voltage and one terminal of the capacitor 111. The switch 105 is turned ON/OFF between an input terminal of the inverter 112 and an output terminal thereof. The switch 106 is turned ON/OFF between an input terminal of the inverter 113 and an output terminal thereof. The switch 107 is turned ON/OFF via the capacitor 115 between an input terminal of the inverter 112 and an output terminal of the inverter 113. The switch 108 is turned ON/OFF via the capacitor 114 between an input terminal of the inverter 113 and an output terminal of the inverter 112. In response to output voltages $V_{O1}$ and $V_{O2}$ from the respective inverters 112 and 113, the current source circuits 116 and 117 supply currents from a power supply $V_{DD}$ to the inverters 111 and 112 so as to apply a high-voltage-sided power supply voltage $V_H$. Also, in response to the output voltages $V_{O1}$ and $V_{O2}$ from the respective inverters 112 and 113, the current source circuits 118 and 119 supply currents from the inverters 112 and 113 to the ground so as to apply a low-voltage-sided power supply voltage $V_L$.

Referring to FIG. 9 to FIG. 10, voltage comparing operations of this conventional voltage comparing circuit will be explained. As represented in FIG. 10, the voltage comparing operations of the voltage comparing circuit shown in FIG. 9 are subdivided into three modes, namely, a preset mode, an amplifying mode, and a latch mode. The following description is made of these modes in turn:

1). PRESET MODE

In this preset mode, the switches 103, 104, 105, 106, 107, and 108 are turned ON, whereas the switch 101 and the switch 102 are turned OFF. As a result, a difference voltage between the plus-sided voltage $V_{R+}$ of the reference voltage and a logical threshold voltage $V_{LT1}$ of the inverter 112 is stored into the capacitor 110, whereas another difference voltage between the minus-sided voltage $V_{R-}$ of the reference voltage and another logical threshold voltage $V_{LT2}$ of the inverter 113 is stored into the capacitor 111.

2). AMPLIFYING MODE

In this amplifying mode, the switches 101 and 102 are turned ON, whereas the switches 103, 104, 105, 106, 107, and 108 are turned OFF. As a result, the inverter 112 amplifies a difference voltage between the plus-sided voltage $V_{I+}$ of the analog input signal and the plus-sided voltage $V_{R+}$ of the reference voltage, whereas the inverter 113 amplifies another difference voltage between the minus-sided voltage $V_{I-}$ of the analog input signal and the minus-sided voltage VR of the reference voltage.

3). LATCH MODE

In this latch mode, the switches 101, 102, 107, and 108 are turned ON, whereas the switches 103, 104, 105, and 106 are turned OFF. As a result, since the inverters 112 and 113 are forwardfed back via the capacitors 114 and 115, these inverters 112 and 113 may be operated as a flip-flop. Therefore, an unbalance in the output amplitudes of the inverters 112 and 113 is enlarged which is caused by the difference voltage between the plus-sided voltage $V_{I+}$ of the analog input signal and the minus-sided voltage $V_{I-}$ thereof, so that this conventional voltage comparing circuit can judge as to whether or not the plus-sided voltage $V_{I+}$ is higher than the minus-sided voltage $V_{I-}$. Precisely speaking, finally, in the transfer characteristic between an input voltage $V_{in}$ of an inverter and an output voltage Vout thereof shown in FIG. 11, the output voltage of one inverter which constitutes the above-described flip-flop is changed to such a value "A" approximated to the power supply voltage VDD, whereas the output voltage of the other inverter which also constitutes the above-described flip-flop is changed to such a value "C" approximated to the ground potential $V_E$. As a consequence, the voltage comparing circuit can judge as to whether or not the plus-sided voltage $V_{I+}$ is higher than the minus-sided voltage $V_{I-}$.

It should be noted that a logical threshold voltage represents a voltage at a point B where the input voltage $V_{in}$ is equal to the output voltage $V_{out}$ in the transfer characteristic shown in FIG. 11. The respective inverters own the logical threshold voltages specific thereto. Concretely speaking, a logical threshold voltage of an inverter is outputted when an input terminal of this inverter is shortcircuited to an output terminal thereof.

In the conventional voltage comparing circuit of FIG. 9, the current source circuits 116, 117, and 118, 119 may be operated as DC parallel resistors $R_{tot1}$ and $R_{tot2}$ by supplying currents in response to the output voltage $V_{O1}$ and $V_{O2}$ of the inverters 112 and 113 based upon mutual conductances $Gm_1$ and $Gm_2$ owned by these current source circuits. The resistance values of these DC parallel resistors $R_{tot1}$ and $R_{tot2}$ are changed, depending upon an average value $(V_{O1}+V_{O2})/2$ of the output voltages $V_{O1}$, $V_{O2}$ of the inverters 112, 113. In this case, these resistance values are changed in a complementary manner. That is, since the average value $(V_{O1}+V_{O2})/2$ is increased, the DC parallel resistor $R_{tot1}$ is increased, whereas the DC parallel resistor $R_{tot2}$ is decreased. As a consequence, since the average value $(V_{O1}+V_{O2})/2$ of the outputs from the inverters 112 and 113 is increased, namely an average value $(V_{in1}+V_{in2})/2$ of the respective input voltages $V_{in1}$, $V_{in2}$ of the inverters 111, 112 is increased, both the high-voltage-sided power supply voltage $V_H$ and the low-voltage-sided power supply voltage $V_L$ of the inverters 112, 113 are moved along the decrease directions. As a consequence, even when there are in-phase mode inputs, the negative feedback is actuated in such a manner that deviation from the operating point set in the preset mode can be suppressed, so that the in-phase mode suppression effect is established. Similarly, this in-phase mode suppression effect is established in the case that the average value $(V_{in1}+V_{in2})/2$ is increased.

As a consequence, in accordance with the conventional voltage comparing circuit of FIG. 9, the comparison operation with high sensitivity can be achieved. A detailed comparison operation of this conventional voltage comparing circuit is described in the above-explained patent application.

However, the above-described conventional voltage comparing circuit owns the following problems. That is, after the difference voltage between the reference voltage and the logical threshold voltage of the inverter has been captured into the respective capacitors 110 and 111 in the preset mode, both the switches 101 and 102 are turned ON in the amplifying mode, so that the difference voltage between the input voltage and the reference voltage is stored into the capacitors 110 and 111, and furthermore, both the switches 105 and 106 are turned OFF to amplify this difference voltage. Then, in the latch mode, the operations of the inverters 112 and 113 are moved to the flip-flop operation. In this case, when the input voltage is varied in response to the noise and the like in a transition time period during which the circuit is initiated as the flip-flop, the state of this flip-flop will be changed in accordance with the variation of the input voltage. As a result, in this case, the timing when the output state as the voltage comparing circuit is determined would be varied.

On the other hand, in the chopper type voltage comparing circuit, it is important that the output state of the comparison result can be determined by correctly sampling the input voltage in a preselected time period. If the timing for determining the output state is varied, then this variation is similar to such a condition that a jitter phenomenon occurs in the sampling period. There is another problem. That is to say, there is a risk that the signal processing precision would be deteriorated.

In the current source circuits 116, 117 and 118, 119 employed in the above-explained conventional voltage comparing circuit, the low-voltage-sided power supply voltage $V_L$ is set substantially equal to the ground potential, and the high-voltage-sided power supply voltage $V_H$ is set substantially equal to the power supply voltage $V_{DD}$, and furthermore, the transistors which constitute the respective current source circuits are operated in the unsaturated region (namely, triode region). As a result, even when the output voltages $V_{O1}$ and $V_{O2}$ of the inverters 112 and 113 are changed, there are small variations in the resistance values of the DC parallel resistors $R_{tot1}$ and $R_{tot2}$. Accordingly, no great expectation can be made as to the in-phase mode (common mode) suppression effect achieved by this constant current itself. On the other hand, since such a current source circuit is provided, there is another problem. That is, the power supply voltage utilization rate would be lowered, so that this conventional voltage comparing circuit cannot be operated under low power supply voltages. In addition, the entire circuit scale of this conventional voltage comparing circuit would be increased, so that the area of the circuit board thereof is increased. Also, since these feedback elements (namely, current source circuits 116 to 119) may function as the load with respect to the output terminal, there is a further problem. That is, the comparing operation speed of this conventional voltage comparing circuit would be lowered by approximately ½, as compared with that of such a voltage comparing circuit in which these feedback elements are not employed.

SUMMARY OF THE INVENTION

The present invention has been made to solve the above-explained problems of the conventional voltage comparing circuit, and therefore, has an object to provide a voltage comparing circuit capable of correctly and periodically determining a polarity of a comparison output based upon a comparison result of input voltages.

Another object of the present invention is to provide a voltage comparing circuit having a small circuit scale and capable of improving precision of signal comparing process operation thereof.

To achieve the above-explained objects, a voltage comparing circuit, according to a first aspect of the present invention is featured by such a voltage comparing circuit comprising:

a first switch turned ON/OFF between a plus-sided voltage of an analog input signal and one terminal of a first capacitor;

a second switch turned ON/OFF between a minus-sided voltage of the analog input signal and one terminal of a second capacitor;

a third switch turned ON/OFF between a plus-sided voltage of a reference voltage and the one terminal of the first capacitor;

a fourth switch turned ON/OFF between a minus-sided voltage of the reference voltage and the one terminal of the second capacitor;

a first inverter connected between an input terminal thereof and the other terminal of the first capacitor;

a second inverter connected between an input terminal thereof and the other terminal of the second capacitor;

a fifth switch turned ON/OFF between the input terminal of the first inverter and an output terminal thereof;

a sixth switch turned ON/OFF between the input terminal of the second inverter and an output terminal thereof;

a seventh switch turned ON/OFF via a third capacitor between the input terminal of the first inverter and the output terminal of the second inverter; and an eighth switch turned ON/OFF via a fourth capacitor between the input terminal of the second inverter and the output terminal of the second inverter; wherein:

the first, second, fifth, sixth, seventh, and eighth switches are turned ON whereas the third and fourth switches are turned OFF in a first operation mode;

the third and fourth switches are turned ON whereas the first, second, fifth, sixth, seventh, and eighth switches are turned OFF in a second operation mode subsequent to the first operation mode; and the third, fourth, seventh, and eighth switches are turned ON whereas the first, second, fifth, and sixth switches are turned OFF in a third operation mode subsequent to the second operation mode, whereby a series of the switching operations is repeatedly carried out so as to compare the voltage of the analog input signal with the reference voltage.

Also, to achieve the above-described objects, a voltage comparing circuit, according to a second aspect of the present invention, is featured by comprising:

a first switch turned ON/OFF between an analog input signal and one terminal of a first capacitor;

a second switch turned ON/OFF between a reference voltage and one terminal of a second capacitor;

a third switch turned ON/OFF between the one terminal of the first capacitor and the one terminal of the second capacitor;

a first inverter connected between an input terminal thereof and the other terminal of the first capacitor;

a second inverter connected between an input terminal thereof and the other terminal of the second capacitor;

a fourth switch turned ON/OFF between the input terminal of the first inverter and an output terminal thereof;

a fifth switch turned ON/OFF between the input terminal of the second inverter and an output terminal thereof;

a sixth switch turned ON/OFF via a third capacitor between the input terminal of the first inverter and the output terminal of the second inverter; and a seventh switch turned ON/OFF via a fourth capacitor between the input terminal of the second inverter and the output terminal of the second inverter; wherein:

the first, second, fourth, fifth, sixth, and seventh switches are turned ON whereas the third switch is turned OFF in a first operation mode;

the third switch is turned ON whereas the first, second, fourth, fifth, sixth, and seventh switches are turned OFF in a second operation mode subsequent to the first operation mode; and the third, sixth, and seventh switches are turned ON whereas the first, second, fourth, and fifth switches are turned OFF in a third operation mode subsequent to the second operation mode, whereby a series of the switching operations is repeatedly carried out so as to compare the voltage of the analog input signal with the reference voltage.

Furthermore, in the voltage comparing circuit as recited in the first, or second aspect of the present invention, another voltage comparing circuit is featured by further comprising: a constant current circuit interposed between power supply input terminals of the first and second inverters, and a power supply.

Furthermore, in the voltage comparing circuit as recited in the first, or second aspect of the present invention, another voltage comparing circuit is featured by that in an end stage of the first operation mode, both the fifth switch and the sixth switch are turned OFF immediately after both the seventh switch and the eighth switch are turned OFF, and thereafter both the first switch and the second switch are turned OFF.

Furthermore, in the voltage comparing circuit as recited in the first, or second aspect of the present invention, another voltage comparing circuit is featured by that both the third switch and the fourth switch are turned OFF before the third operation mode is accomplished.

Moreover, in the voltage comparing circuit as recited in the first, or second aspect of the present invention, another voltage comparing circuit is featured in such that the first inverter is arranged by series-connecting a first P-channel transistor to a first N-channel transistor; and the second inverter is arranged by series-connecting a second P-channel transistor to a second N-channel transistor.

Moreover, in the voltage comparing circuit as recited in the first, or second aspect of the present invention, another voltage comparing circuit is featured in such that the constant current circuit is arranged by a third P-channel transistor.

Moreover, in the voltage comparing circuit as recited in the first, or second aspect of the present invention, another voltage comparing circuit is featured in such that a channel length of each of the first and second P-channel transistors and also of the first and second N-channel transistors is selected to be approximately 0.35 $\mu$m so as to obtain voltage comparing precision of 8 bits.

Moreover, in the voltage comparing circuit as recited in the first, or second aspect of the present invention, another voltage comparing circuit is featured in such that a balance type voltage comparing circuit is constituted by employing the first to eight switches, the first and second inverters, and the first to fourth capacitors; and both the first and second inverters are operable as a flip-flop circuit.

In the circuit arrangement of the above-described voltage comparing circuit according to the first aspect of the present invention, in the first operation mode, the difference voltage between the plus-sided voltage of the analog input signal and the logical threshold voltage of the first inverter is stored in the first capacitor, and also the difference voltage between the minus-sided voltage of the analog input signal and the logical threshold voltage of the second inverter is stored in the second capacitor, and furthermore, the difference voltage between the logical threshold voltage of the first inverter and the logical threshold voltage of the second inverter is stored in both the third capacitor and the fourth capacitor. In the second operation mode, the difference voltage between the plus-sided voltage of the analog input signal and the plus-sided voltage of the reference voltage is amplified by the first inverter, and also the difference voltage between the minus-sided voltage of the analog input signal and the minus-sided voltage of the reference voltage is amplified by the second inverter. Then, in the third operation mode, both the first inverter and the second inverter are operated as the flip-flop. As a consequence, this voltage comparing circuit can produce such a judgment result as to whether or not the difference voltage between the plus-sided voltage of the analog input signal and the plus-sided voltage of the reference voltage is higher than the difference voltage between the minus-sided voltage of the analog input signal and the minus-sided voltage of the reference voltage. As a consequence, when the plus-sided voltage of the reference voltage is made equal to the minus-sided voltage of this reference voltage, this voltage comparing circuit can correctly judge as to whether or not the plus-sided voltage of the analog input signal is higher than the minus-sided voltage of this analog input signal.

In accordance with the above-described circuit arrangement, since a total number of circuit elements is small, the balance type voltage comparing circuit can be made compact, and also can be operated under low power consumption. Furthermore, since the offset voltages of two sets of inverters have no relationship with the judgement result, the channel lengths of the transistors for constituting these inverters can be shortened.

In this case, since the constant current circuit is inserted into the power supply input terminals for both the inverters, the consumed current can be lowered.

Also, in the end stage of the first operation mode, both the fifth switch and the sixth switch are turned OFF immediately after both the seventh switch and the eighth switch are turned OFF, and thereafter both the first switch and the second switch are turned OFF. As a result, this voltage comparing circuit can precisely determine the proper sampling timing, and can made this sampling operation under stable condition.

Furthermore, both the third switch and the fourth switch are turned OFF before the third operation mode is accomplished. Accordingly, this voltage comparing circuit can quickly determine the state of the flip-flop operatively arranged by the first and second inverters.

In the circuit arrangement of the above-described voltage comparing circuit according to the second aspect of the present invention, in the first operation mode, the difference voltage between the analog input signal voltage and the logical threshold voltage of the first inverter is stored in the first capacitor, and also the difference voltage between the reference voltage and the logical threshold voltage of the second inverter is stored in the second capacitor, and furthermore, the difference voltage between the logical threshold voltage of the first inverter and the logical threshold voltage of the second inverter is stored in both the third capacitor and the fourth capacitor. In the second operation mode, the difference voltage between the analog input signal voltage and the logical threshold voltage of the first inverter, and also the difference voltage between the reference voltage and the logical threshold voltage of the second inverter are redistributed to the first capacitor and the second capacitor. Then, the potential variations appearing on the output sides of the first capacitor and the second capacitor are amplified by the first inverter and the second inverter. Thereafter, in the third operation mode, both the first inverter and the second inverter are operated as the flip-flop. As a consequence, this voltage comparing circuit can produce such a judgment result as to whether or not the analog input signal voltage is higher than the reference voltage.

In accordance with the above-described circuit arrangement, since a total number of circuit elements is small, the voltage comparing circuit can be made compact, and also can be operated under low power consumption. Furthermore, since the offset voltages of two sets of inverters have no relationship with the judgement result, the channel lengths of the transistors for constructing the inverters can be shortened. As a result, the highspeed voltage comparing operation can be achieved.

In this case, since the constant current circuit is inserted into the power supply input terminals for both the inverters, the consumed current can be lowered.

Also, in the end stage of the first operation mode, both the fourth switch and the fifth switch are turned OFF immediately after both the sixth switch and the seventh switch are turned OFF, and thereafter both the first switch and the second switch are turned OFF. This voltage comparing circuit can precisely determine the proper sampling timing, and can made this sampling operation under stable condition.

Furthermore, the third switch is turned OFF before the third operation mode is accomplished. As a consequence, this voltage comparing circuit can quickly determine the state of the flip-flop operatively arranged by the first and second inverters.

Similarly, to achieve the above-explained objects of the present invention, a voltage comparing method, according to a third aspect of the present invention, is featured by comprising:

a first step for executing a first operation mode in such a manner that a first difference voltage between a plus-sided voltage of an analog input signal and a logical threshold voltage of a first inverter is stored in a first capacitor, and a second difference voltage between a minus-sided of the analog input signal and a logical threshold voltage of a second inverter is stored in a second capacitor, and also a third difference voltage between the logical threshold voltage of the first inverter and the logical threshold voltage of the second inverter is stored in both a third capacitor and a fourth capacitor;

a second step for executing a second operation mode in such a manner that a fourth difference voltage between the plus-sided voltage of the analog input signal and a plus-sided voltage of a reference voltage is amplified by a first inverter, and also a fourth difference voltage between the minus-sided voltage of the analog input signal and a minus-sided voltage of the reference voltage is amplified by a second inverter; and a third step for executing a third operation step in such a manner that both the first inverter and the second inverter are operated as a flip-flop circuit; whereby
the first to third steps are repeatedly carried out so as to compare the voltage of the analog input signal with the reference voltage.

In addition, to achieve the above-explained objects of the present invention, a voltage comparing method, according to a fourth aspect of the present invention, is featured by comprising:

a first step for executing a first operation mode in such a manner that a first difference voltage between a voltage of an analog input signal and a logical threshold voltage of a first inverter is stored in a first capacitor, and a second difference voltage between a reference voltage and a logical threshold voltage of a second inverter is stored in a second capacitor, and also a third difference voltage between the logical threshold voltage of the first inverter and the logical threshold voltage of the second inverter is stored in both a third capacitor and a fourth capacitor;

a second step for executing a second operation mode in such a manner that both the first difference voltage between the analog input signal voltage and the logical threshold voltage of the first inverter, and the second difference voltage between the reference voltage and the logical threshold voltage of the second inverter are redistributed into the first and second capacitors, and further, potential variations appearing on the output sides of the first and second capacitors are amplified by the first inverter and the second inverter, respectively; and a third step for executing a third operation step in such a manner that both the first inverter and the second inverter are operated as a flip-flop circuit; whereby
the first to third steps are repeatedly carried out so as to compare the voltage of the analog input signal with the reference voltage.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Referring to drawings, voltage comparing circuits according to various preferred embodiments of the present invention will be described more in detail.

Circuit Arrangement of First Voltage Comparing Circuit

A first embodiment of the present invention is directed to a full-balance type voltage comparing circuit.

Figure 1:
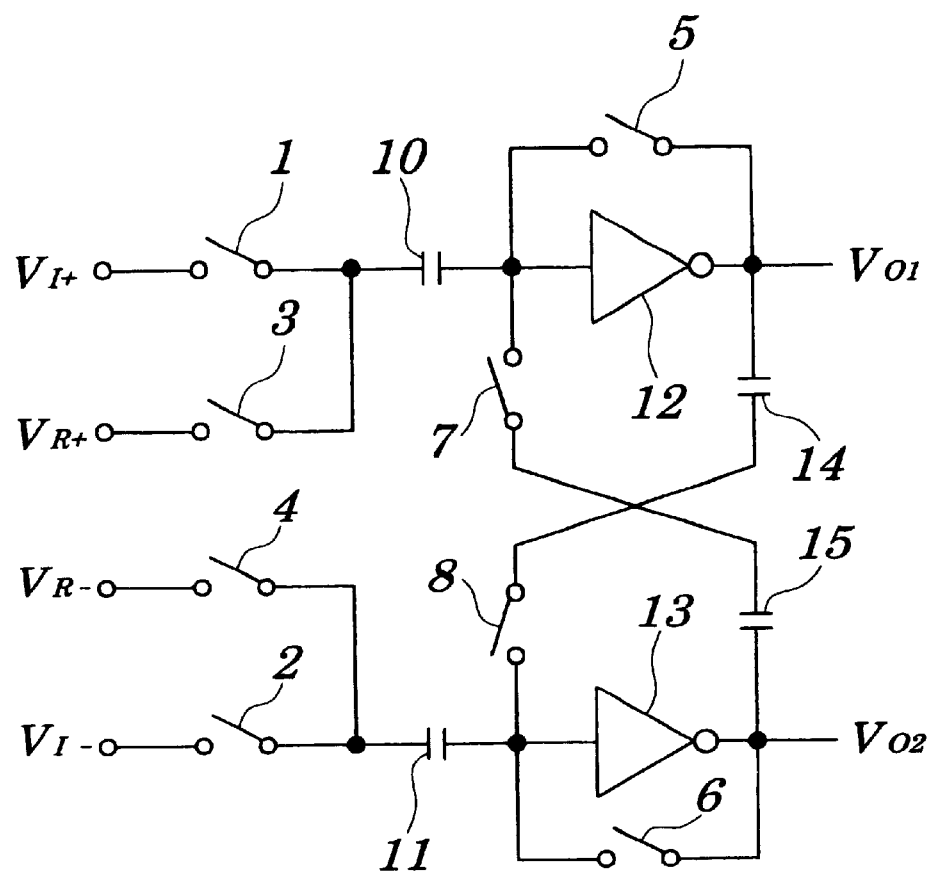
FIG. 1 is a schematic circuit diagram for indicating an internal circuit arrangement of a voltage comparing circuit according to a first embodiment of the present invention.

FIG. 1 is a schematic circuit diagram for indicating an internal circuit arrangement of a voltage comparing circuit according to the first embodiment of the present invention. FIG. 2(a) to FIG. 2(c) explanatorily show circuit connection conditions of the voltage comparing circuit shown in FIG. 1 in various modes. FIG. 3 represents an operation timing chart of the voltage comparing circuit shown in FIG. 1.

As indicated in FIG. 1, the first voltage comparing circuit is mainly arranged by a switch 1, another switch 2, another switch 3, another switch 4, another switch 5, another switch 6, another switch 7, another switch 8, a capacitor 10, another capacitor 11, an inverter 12, another inverter 13, another capacitor 14, and another capacitor 15.

In this first voltage comparing circuit, the switch 1 is turned ON/OFF between a plus-sided voltage $V_{I+}$ of an analog input signal and one terminal of the capacitor 1. The switch 2 is turned ON/OFF between a minus-sided voltage $V_{I-}$ of the analog input signal and one terminal of the capacitor 11. The switch 3 is turned ON/OFF between a plus-sided voltage $V_{R+}$ of a reference voltage and one terminal of the capacitor 10. The switch 4 is turned ON/OFF between a minus-sided voltage $V_{R-}$ of the reference voltage and one terminal of the capacitor 11. The switch 5 is turned ON/OFF between an input terminal of the inverter 12 and an output terminal thereof.

The switch 6 is turned ON/OFF between an input terminal of the inverter 13 and an output terminal thereof. The switch 7 is turned ON/OFF via the capacitor 15 between an input terminal of the inverter 12 and an output terminal of the inverter 13. The switch 8 is turned ON/OFF via the capacitor 14 between an input terminal of the inverter 13 and an output terminal of the inverter 12.

Voltage Comparing Operation of First Voltage Comparing Circuit

Figure 2:
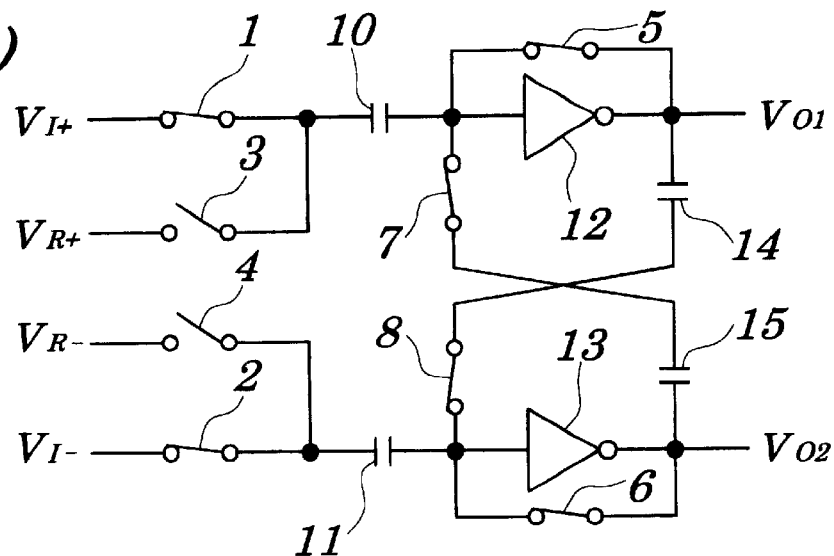
FIG. 2(a) to FIG. 2(c) explanatorily show circuit connection conditions of the voltage comparing circuit shown in FIG. 1 in various modes.
Figure 2:
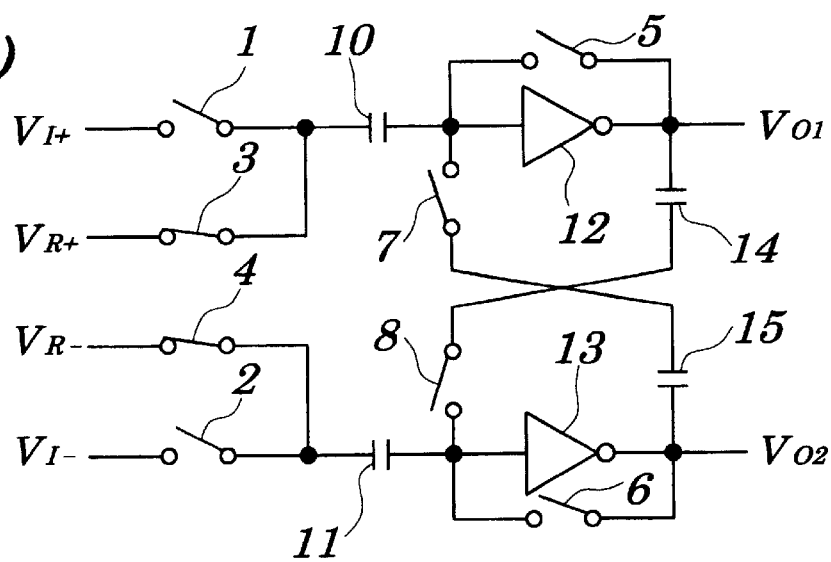
Figure 2:
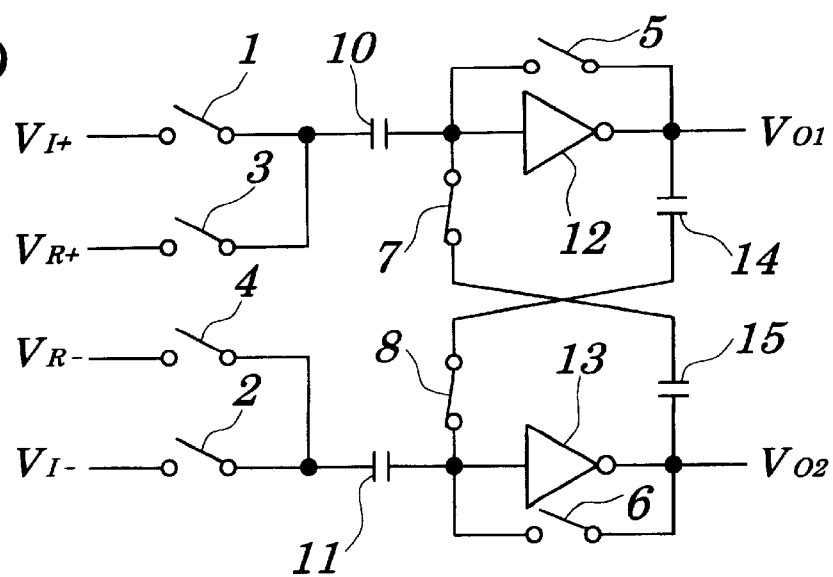
Figure 3:
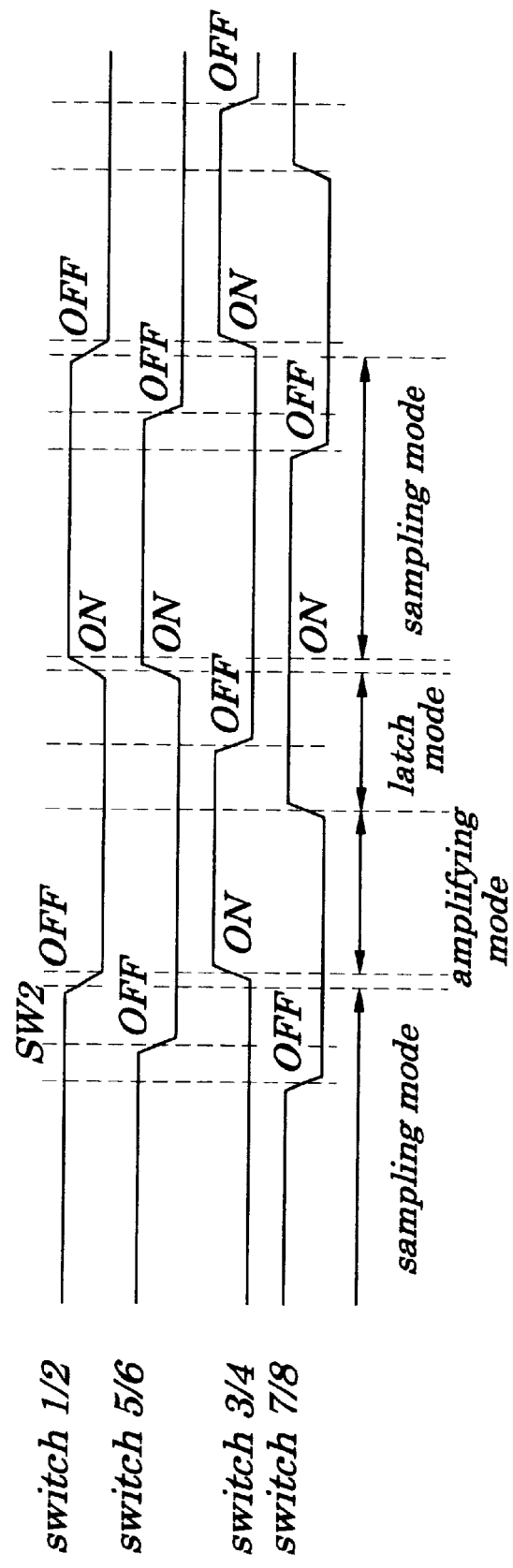
FIG. 3 represents an operation timing chart of the voltage comparing circuit shown in FIG. 1.

Referring to FIG. 1 to FIG. 3, voltage comparing operations of this first voltage comparing circuit will be explained. As represented in FIG. 2(a) to FIG. 2(c), the voltage comparing operations of the first voltage comparing circuit shown in FIG. 1 are subdivided into three modes, namely, an input sampling mode, an amplifying mode, and a latch mode. The following description is made of these modes in turn:

1). INPUT SAMPLING MODE

In this input sampling mode, the switches 1, 2, 5, 6, 7, and 8 are turned ON, whereas the switch 3 and the switch 4 are turned OFF. As a result, a difference voltage between the plus-sided voltage $V_{I+}$ of the analog input signal and a logical threshold voltage $V_{LT1}$ of the inverter 12 is stored into the capacitor 10, whereas another difference voltage between the minus-sided voltage $V_{I-}$ of the analog input signal and another logical threshold voltage $V_{LT2}$ of the inverter 13 is stored into the capacitor 11. Furthermore, another difference voltage between these logical threshold voltages $V_{LT1}$ and $V_{LT2}$ is stored into the capacitors 14 and 15.

2). AMPLIFYING MODE

In this amplifying mode, the switches 3 and 4 are turned ON, whereas the switches 1, 2, 5, 6, 7, and 8 are turned OFF. As a result, the inverter 12 amplifies a difference voltage between the plus-sided voltage $V_{I+}$ of the analog input signal and the plus-sided voltage $V_{R+}$ of the reference voltage, whereas the inverter 13 amplifies another difference voltage between the minus-sided voltage $V_{I-}$ of the analog input signal and the minus-sided voltage $V_{R-}$ of the reference voltage, so that these inverters 12/13 produce outputs $V_{O1}$ and $V_{O2}$, respectively.

3). LATCH MODE

Figure 11:
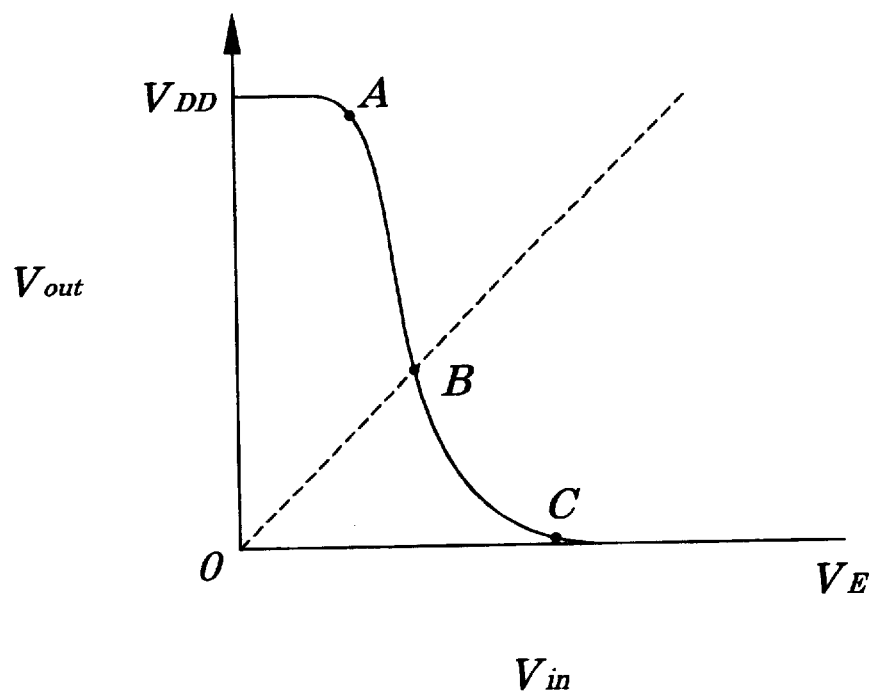
FIG. 11 represents a transfer characteristic of an inverter.

In this latch mode, the switches 3, 7, and 8 are turned ON, whereas the switches 1, 2, 5, and 6 are turned OFF. As a result, since the inverters 12 and 13 are forward-fed back via the capacitors 14 and 15, these inverters 12 and 13 may be operated as a flip-flop. Therefore, an unbalance in the output amplitudes of the inverters 112 and 113 is enlarged which is caused by the difference voltage between the plus-sided voltage $V_{I+}$ of the analog input signal and the minus-sided voltage $V_{I-}$ thereof when the plus-sided voltage $V_{R+}$ of the reference voltage is equal to the minus-sided voltage $V_{R-}$ thereof, so that this first voltage comparing circuit can judge as to whether or not the plus-sided voltage $V_{I+}$ is higher than the minus-sided voltage $V_{I-}$. Precisely speaking, finally, in the transfer characteristic between the input voltage $V_{in}$ of the inverter and the output voltage Vout thereof shown in FIG. 11, the output voltage of one inverter which constitutes the above-described flip-flop is changed to such a value "A" approximated to the power supply voltage $V_{DD}$, whereas the output voltage of the other inverter which also constitutes the above-described flip-flop is changed to such a value "C" approximated to the ground potential $V_E$. As a consequence, the first voltage comparing circuit can judge as to whether or not the plus-sided voltage $V_{I+}$ is higher than the minus-sided voltage $V_{I-}$.

As previously described, in accordance with this first voltage comparing circuit, the above-explained full-balance type voltage comparing circuit can be simply arranged by 2 sets of inverters 12/13, 8 sets of switches 1 to 8, and 4 sets of capacitors 10/11 and 14/15. As a consequence, this first voltage comparing circuit can be made compact, and also can be operated under low power consumption. In general, when a channel length of a transistor which constitutes an inverter is tried to be shortened so as to realize a highspeed operation, since an offset voltage is increased due to an adverse influence of a fluctuation, this channel length cannot be readily made short. However, in accordance with this first embodiment, since a difference voltage between the logical threshold voltages of the two inverters, namely the offset voltage has no relationship with the comparison judgement result, the channel lengths of the transistors which constitute these inverters can be made shorter. As a consequence, the highspeed comparing operation by this first voltage comparing circuit can be realized.

One typical example as to this channel length of the transistor will be given as follows: In the conventional voltage comparing circuit, the channel length of approximately 1.5 $\mu$m is required in order to achieve 8-bit precision. In contrast, in accordance with the first voltage comparing circuit, the channel length can be preferably made as 0.35 $\mu$m. Therefore, the highspeed comparing operation by the first voltage comparing circuit can be realized.

Furthermore, in this first voltage comparing circuit, after the input signal voltages $V_{I+}$ and $V_{I-}$ have been held in the capacitors 10 and 11 in the input sampling mode, the reference voltages $V_{R+}$ and $V_{R-}$ are acquired in the amplifying mode, and then the inverters are operable as the flip-flop operation in the latch mode. As a result, the sampling timing of the input voltages can be correctly and periodically determined, so that the precision of the input signal comparing process operation can be improved.

In addition, since no current source circuit capable of performing the in-phase mode suppressing operation is longer required, this first voltage comparing circuit can be operated under low power supply voltages. Moreover, the entire circuit scale and the circuit board area of this first voltage comparing circuit can be reduced.

Circuit Arrangement of Second Voltage Comparing Circuit

Next, a voltage comparing circuit according to a second embodiment of the present invention is featured by that in the above-explained first voltage comparing circuit, total current consumption of the power supply is reduced.

Figure 4:
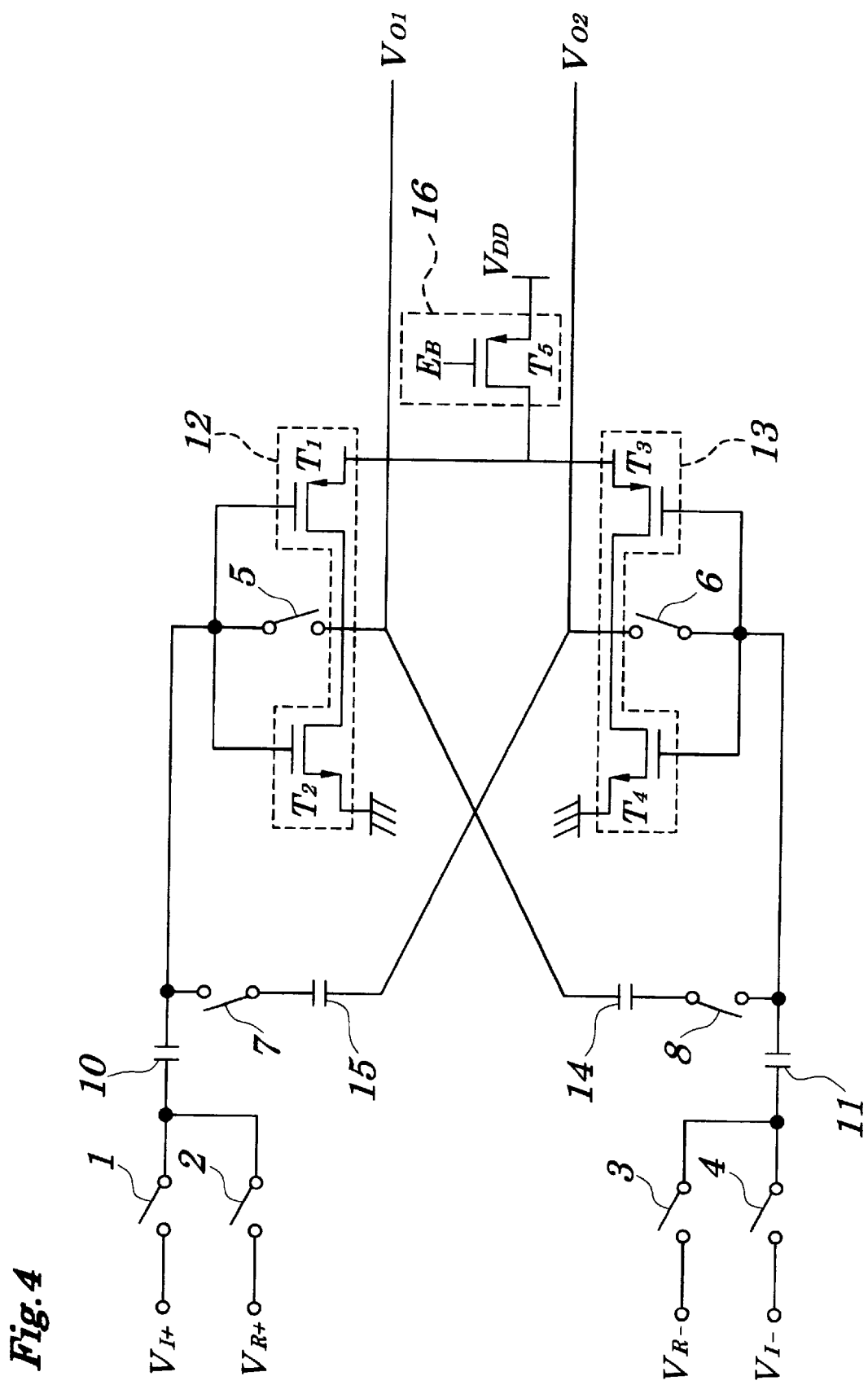
FIG. 4 is a schematic circuit diagram for showing an internal circuit arrangement of a voltage comparing circuit according to a second embodiment of the present invention.

FIG. 4 is a schematic circuit diagram for showing an internal circuit arrangement of the voltage comparing circuit according to the second embodiment of the present invention.

As indicated in FIG. 4, the second voltage comparing circuit is mainly arranged by a switch 1, another switch 2, another switch 3, another switch 4, another switch 5, another switch 6, another switch 7, another switch 8, a capacitor 10, another capacitor 11, an inverter 12, another inverter 13, another capacitor 14, another capacitor 15, and a current source circuit 16.

In this second voltage comparing circuit, the switch 1 is turned ON/OFF between a plus-sided voltage $V_{I+}$ of an analog input signal and one terminal of the capacitor 10. The switch 2 is turned ON/OFF between a minus-sided voltage $V_{I-}$ of the analog input signal and one terminal of the capacitor 11. The switch 13 is turned ON/OFF between a plus-sided voltage $V_{R+}$ of a reference voltage and one terminal of the capacitor 10. The switch 4 is turned ON/OFF between a minus-sided voltage $V_{R-}$ of the reference voltage and one terminal of the capacitor 11. The switch 5 is turned ON/OFF between an input terminal of the inverter 12 and an output terminal thereof. The switch 6 is turned ON/OFF between an input terminal of the inverter 13 and an output terminal thereof.

The switch 7 is turned ON/OFF via the capacitor 15 between an input terminal of the inverter 12 and an output terminal of the inverter 13. The switch 8 is turned ON/OFF via the capacitor 14 between an input terminal of the inverter 13 and an output terminal of the inverter 12. As the inverter 12, FIG. 4 shows such an arrangement that a P-channel transistor $T_1$ is connected in series to an N-channel transistor $T_2$. Similarly, as the inverter 13, FIG. 4 represents such an arrangement that a P-channel transistor $T_3$ is connected in series to an N-channel transistor $T_4$. The constant current circuit 16 is constructed of a P-channel transistor $T_5$. Since a constant voltage $E_B$ is applied as a bias voltage to this constant current circuit 16, power supply currents lower than, or equal to a predetermined value may be supplied to both the inverters 12 and 13 by this constant current circuit 16.

Comparing Operation By Second Voltage Comparing Circuit

Referring to FIG. 4, comparing operations of this second voltage comparing circuit will be explained. It should be understood that operations of the circuit portions arranged by the switches 1 to 8, the capacitors 10/11, the inverters 12/13, and the capacitors 14/15 in the second voltage comparing circuit shown in FIG. 4 are similar to those of the first voltage comparing circuit indicated in FIG. 1.

Moreover, in the second voltage comparing circuit of FIG. 4, since the constant current circuit 16 is interposed between two sets of the inverters 12/13 and the power supply $V_{DD}$, which constitute the voltage comparing circuit, a maximum current flowing through the two inverters 12 and 13 becomes substantially constant irrespective of the power supply voltage.

In the first and second voltage comparing circuits indicated in FIG. 1 and FIG. 4, when the switches 5 and 6 are turned ON in the input sampling mode so as to shortcircuit the input/output paths of the inverters 12 and 13, the power consumption becomes maximum. In this case, when the power supply voltage is changed in the first voltage comparing circuit of FIG. 1, the power consumption is largely changed. To the contrary, since the constant current circuit 16 is additionally provided with the second voltage comparing circuit shown in FIG. 4, even when the power supply voltage is changed, there is a very small change in the currents consumed in the inverters 12 and 13.

As previously described in detail, in accordance with the second voltage comparing circuit, since a total number of circuit elements is small by which the second voltage comparing circuit is arranged, the resultant voltage comparing circuit can be made compact, and also can be operated under low power consumption. Furthermore, since the offset voltages of two sets of inverters have no relationship with the judgement result, the channel lengths of the transistors can be shortened. As a result, the highspeed voltage comparing operation can be achieved. Also, in this second voltage comparing circuit, the sampling timing of the input voltages can be correctly and periodically determined, so that the precision of the input signal comparing process operation can be improved.

In addition, since no current source circuit capable of performing the in-phase mode suppressing operation is longer required, this second voltage comparing circuit can be operated under low power supply voltages. Moreover, the entire circuit scale and the circuit board area of this second voltage comparing circuit can be reduced.

Moreover, in accordance with the second voltage comparing circuit, since the constant current circuit is additionally provided with the power supply of the two inverters which constitute this voltage comparing circuit, even when the power supply voltage is varied, there is a very small change in the consumed current. In such a case that the above-described current limitation is not made, it is required to design such a voltage comparing circuit based upon a power supply current capable of satisfying a required operation speed under the worst conditions caused by the adverse influences of the process variations and the power supply voltage. As a consequence, this designed voltage comparing circuit would own the excessively better performance under any conditions other than the worst condition, for instance, would require a higher consumed current than that for the normal operation condition more than 4 times. To the contrary, in accordance with this second voltage comparing circuit, since this second voltage comparing circuit can be continuously operated under minimum power supply current, the power supply circuit thereof can be made with necessary minimum performance. As a consequence, the difference between the minimum consumed current and the maximum consumed current could be reduced by approximately 1.5 times.

Circuit Arrangement of Third Voltage Comparing Circuit

Figure 5:
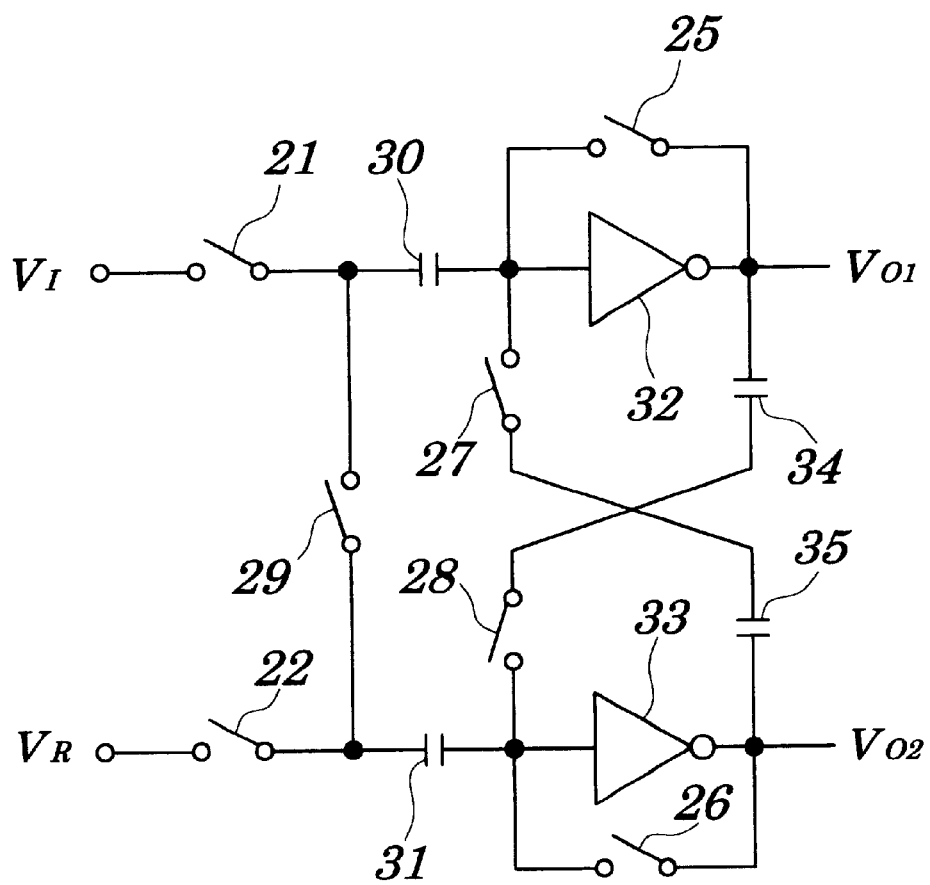
FIG. 5 is a schematic circuit diagram for indicating an internal circuit arrangement of a voltage comparing circuit according to a third embodiment of the present invention.

A third embodiment of the present invention is realized as an unbalance (single ended) type voltage comparing circuit. FIG. 5 is a schematic circuit diagram for indicating an internal circuit arrangement of a voltage comparing circuit according to a third embodiment of the present invention. FIG. 6(a) to FIG. 6(c) explanatorily show circuit connection conditions of the voltage comparing circuit shown in FIG. 5 in various modes. FIG. 7 represents an operation timing chart of the voltage comparing circuit shown in FIG. 5.

As indicated in FIG. 5, the third voltage comparing circuit is mainly arranged by a switch 21, another switch 22, another switch 25, another switch 26, another switch 27, another switch 28, another switch 29, a capacitor 30, another capacitor 31, an inverter 32, another inverter 33, another capacitor 34, and another capacitor 35.

In this third voltage comparing circuit, the switch 21 is turned ON/OFF between a voltage $V_I$ of an analog input signal and one terminal of the capacitor 30. The switch 22 is turned ON/OFF between a reference voltage $V_R$ and one terminal of the capacitor 31. The switch 25 is turned ON/OFF between an input terminal of the inverter 32 and an output terminal thereof. The switch 26 is turned ON/OFF between an input terminal of the inverter 33 and an output terminal thereof. The switch 27 is turned ON/OFF via the capacitor 35 between an input terminal of the inverter 32 and an output terminal of the inverter 33. The switch 28 is turned ON/OFF via the capacitor 34 between an input terminal of the inverter 33 and an output terminal of the inverter 32. A switch 29 is turned ON/OFF between one terminal of the capacitor 30 and one terminal of the capacitor 31.

Comparing Operation of Third Voltage Comparing Circuit

Figure 6:
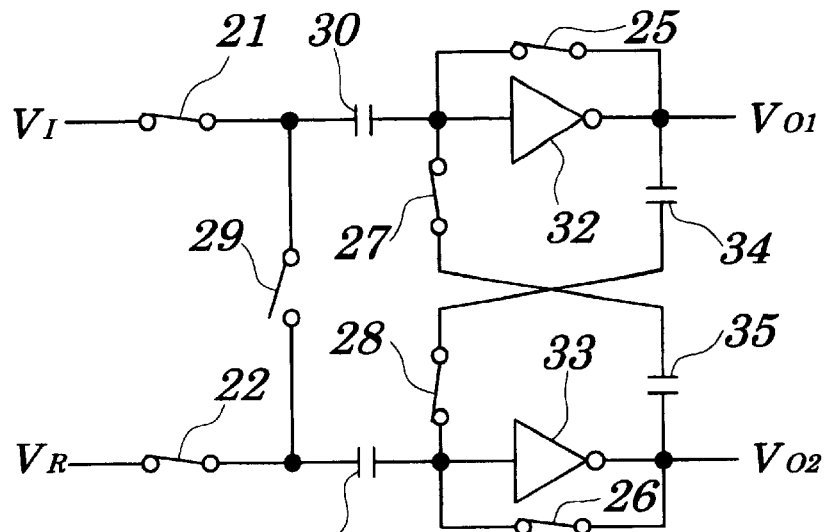
FIG. 6(a) to FIG. 6(c) explanatorily show circuit connection conditions of the voltage comparing circuit shown in FIG. 5 in various modes.
Figure 6:
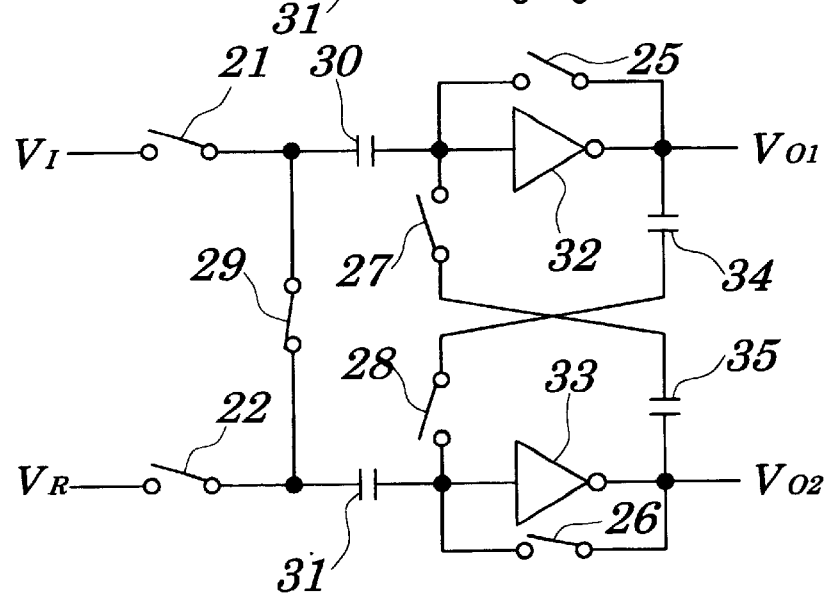
Figure 6:
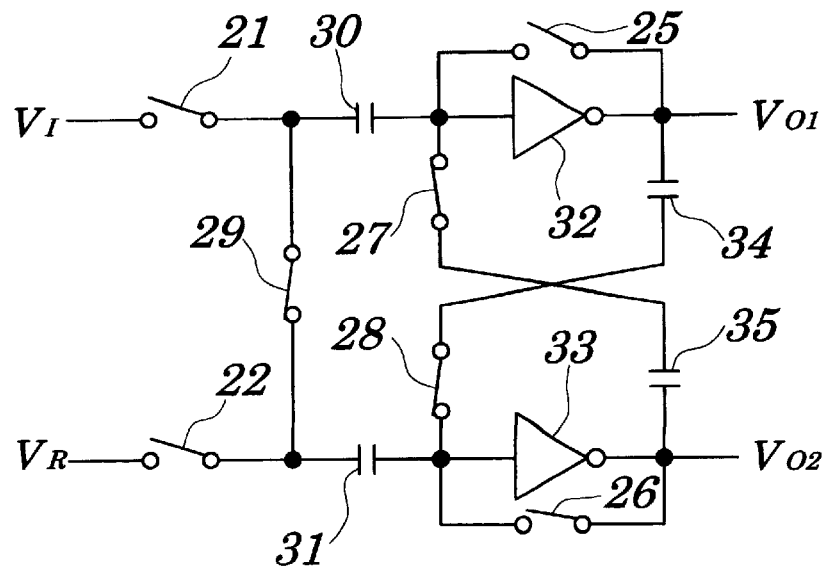
Figure 7:
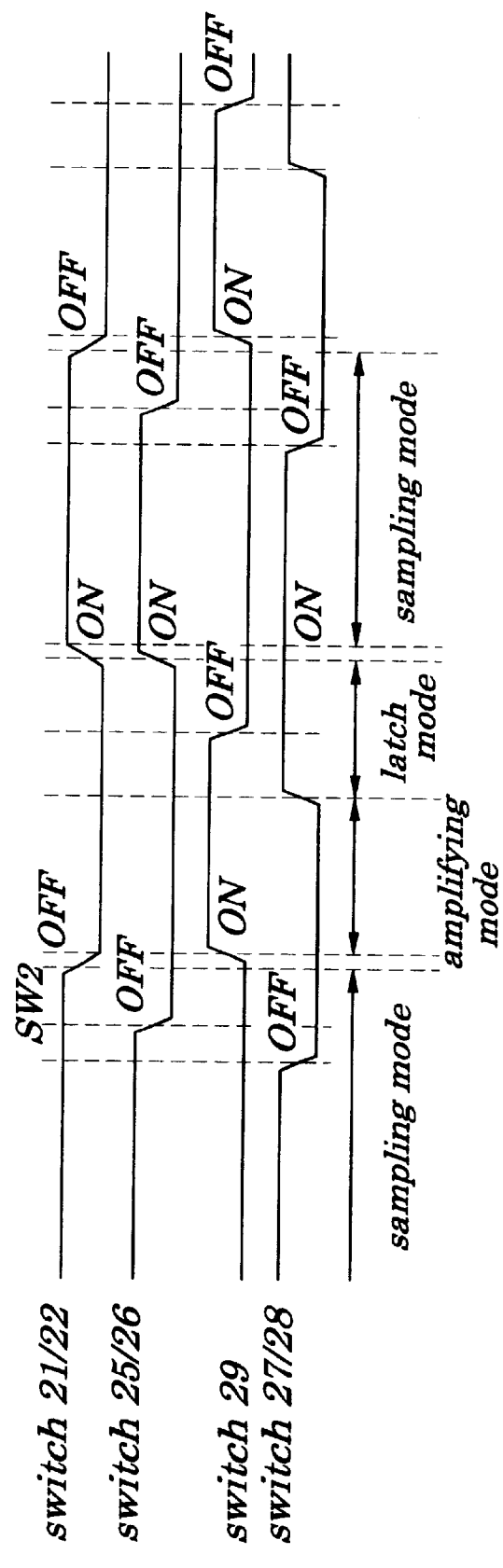
FIG. 7 represents an operation timing chart of the voltage comparing circuit shown in FIG. 5.

Referring to FIG. 5 to FIG. 7, voltage comparing operations of this conventional voltage comparing circuit will be explained. As represented in FIG. 6(a), FIG. 6(b), FIG. 6(c), the voltage comparing operations of the voltage comparing circuit shown in FIG. 5 are subdivided into three modes, namely, an input sampling mode, an amplifying mode, and a latch mode. The following description is made of these modes in turn:

1). INPUT SAMPLING MODE

In this input sampling mode, the switches 21, 22, 25, 26, 27, and 28 are turned ON, whereas the switch 29 is turned OFF. As a result, a difference voltage between the input signal voltage $V_I$ and a logical threshold voltage $V_{LT1}$ of the inverter 32 is stored into the capacitor 30, whereas another difference voltage between the reference voltage $V_R$ and another logical threshold voltage $V_{LT2}$ of the inverter 33 is stored into the capacitor 31. Also, difference voltage between the logical threshold voltage $V_{LT1}$ and the logical threshold voltage $V_{LT2}$ is stored into the capacitors 34 and 35.

2). AMPLIFYING MODE

In this amplifying mode, the switch 29 is turned ON, whereas the switches 21, 22, 25, 26, 27, and 28 are turned OFF. As a result, the electron charges stored in the capacitors 30 and 31 are redistributed, and then the inverter 32 amplifies a potential variation existed on the output side of the capacitor 30, and further the inverter 33 amplifies a potential variation existed on the output side of the capacitor 31, so that the inverter 32 produces the output $V_{O1}$ and the inverter 33 produces the output $V_{O2}$.

3). LATCH MODE

In this latch mode, the switches 27, 28, and 29 are turned ON, whereas the switches 21, 22, 25, and 26 are turned OFF. As a result, since the inverters 32 and 33 are forward-fed back via the capacitors 34 and 35, these inverters 32 and 33 may be operated as a flip-flop. Therefore, an unbalance in the output amplitudes of the inverters 32 and 33 is enlarged which is caused by the difference voltage between the voltage $V_I$ of the analog input signal and the reference voltage $V_R$, so that this third voltage comparing circuit can judge as to whether or not the input signal voltage $V_I$ is higher than the reference voltage $V_R$. Precisely speaking, finally, in the transfer characteristic between the input voltage $V_{in}$ of the inverter and the output voltage Vout thereof shown in FIG. 11, the output voltage of one inverter is changed to such a value "A" approximated to the power supply voltage $V_{DD}$, whereas the output voltage of the other inverter is changed to such a value "C" approximated to the ground potential $V_E$. As a consequence, the third voltage comparing circuit can judge as to whether or not the input signal voltage $V_I$ is higher than the reference voltage $V_R$.

As explained above, in accordance with the third voltage comparing circuit, since the unbalance type voltage comparing circuit can be constituted by merely employing two sets of inverters, seven sets of switches, and four sets of capacitors, this unbalance type voltage comparing circuit can be made compact, and also can be operated under low power consumption. Furthermore, since the difference voltages of these two inverters, namely the offset voltages of two sets of inverters have no relationship with the judgement result, the channel lengths of the transistors can be shortened. As a result, the highspeed voltage comparing operation can be achieved.

In this third voltage comparing circuit, the input signal voltage $V_I$ is held in the capacitor 30 and also the reference voltage $V_R$ is held in the capacitor 31 in the input sampling mode. Then, the electron charges stored in these capacitors 30 and 31 are redistributed, and the difference voltage between the input voltage and the reference voltage is amplified by two sets of inverters in the amplifying mode. In the latch mode, these inverters are operated as the flip-flop operation. Consequently, in this third voltage comparing circuit, the sampling timing of the input voltages can be correctly and periodically determined, so that the precision of the input signal comparing process operation can be improved.

In addition, since no current source circuit capable of performing the in-phase mode suppressing operation is longer required, this third voltage comparing circuit can be operated under low power supply voltages. Moreover, the entire circuit scale and the circuit board area of this third voltage comparing circuit can be reduced.

Circuit Arrangement of Fourth Voltage Comparing Circuit

Next, a voltage comparing circuit according to a fourth embodiment of the present invention is featured by that in the above-explained third voltage comparing circuit, total current consumption of the power supply is reduced.

Figure 8:
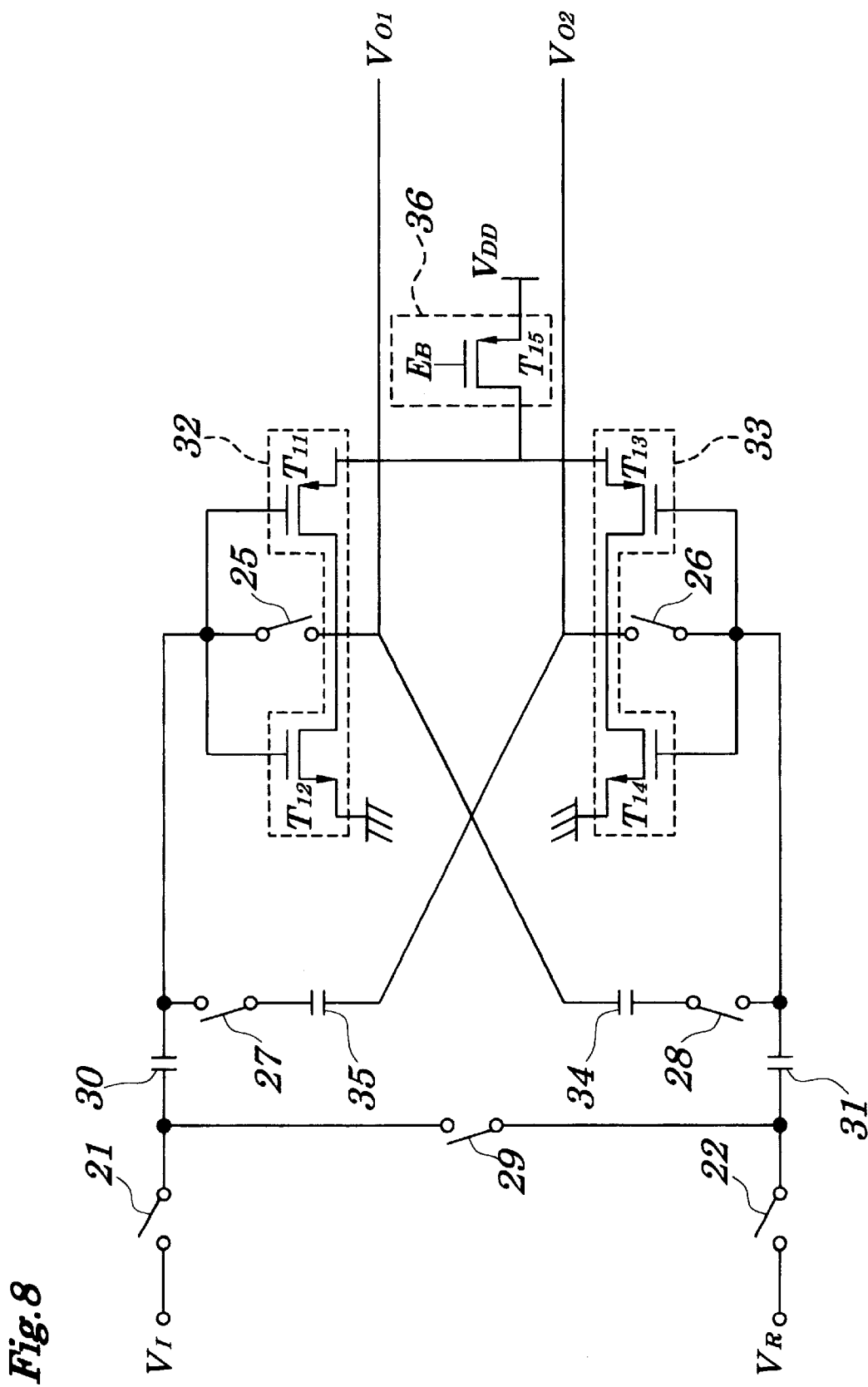
FIG. 8 is a schematic circuit diagram for showing an internal circuit arrangement of a voltage comparing circuit according to a fourth embodiment of the present invention.
Figure 9:
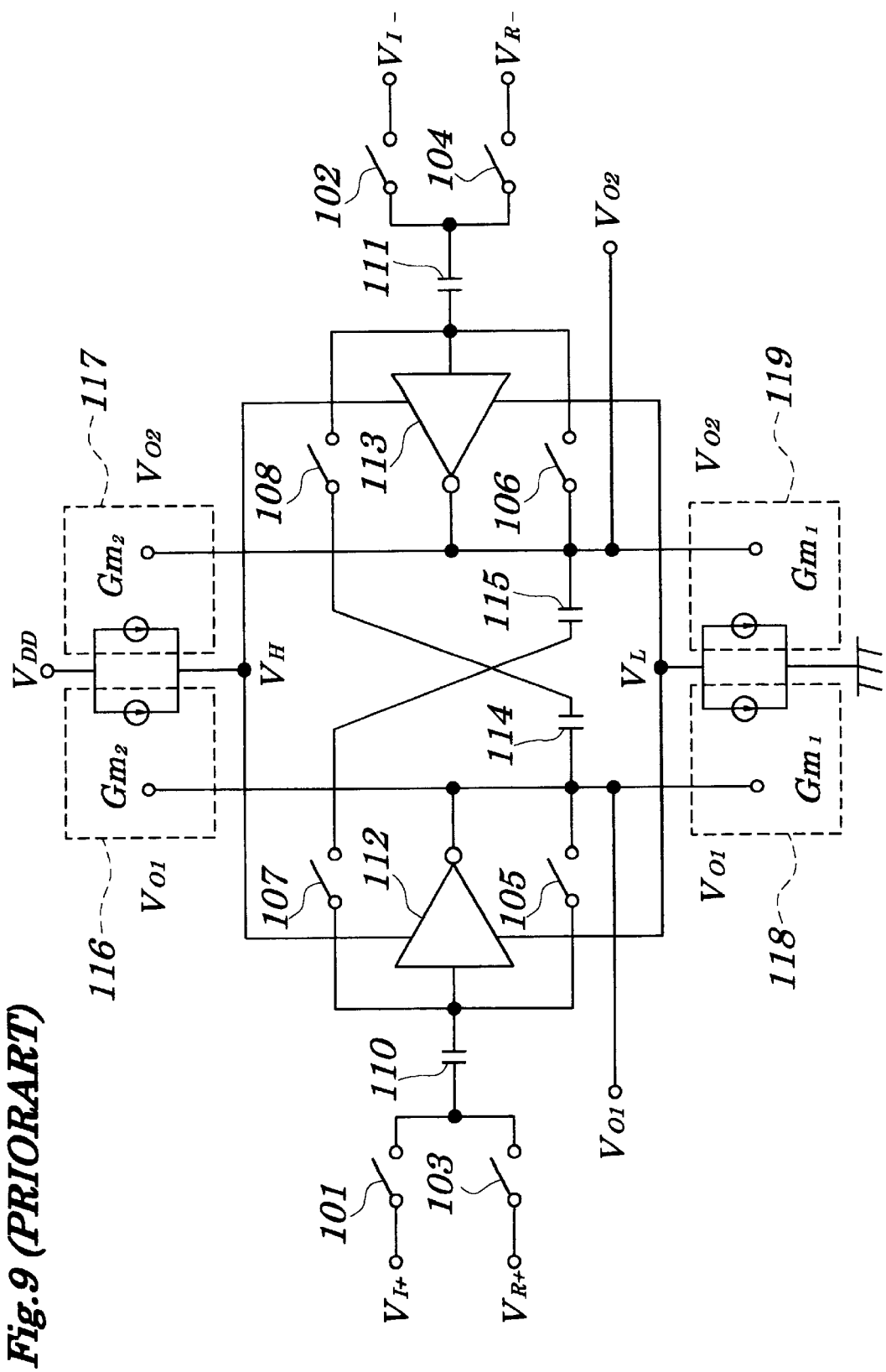
FIG. 9 is the schematic circuit diagram for indicating the internal circuit arrangement of the conventional voltage comparing circuit.
Figure 10:
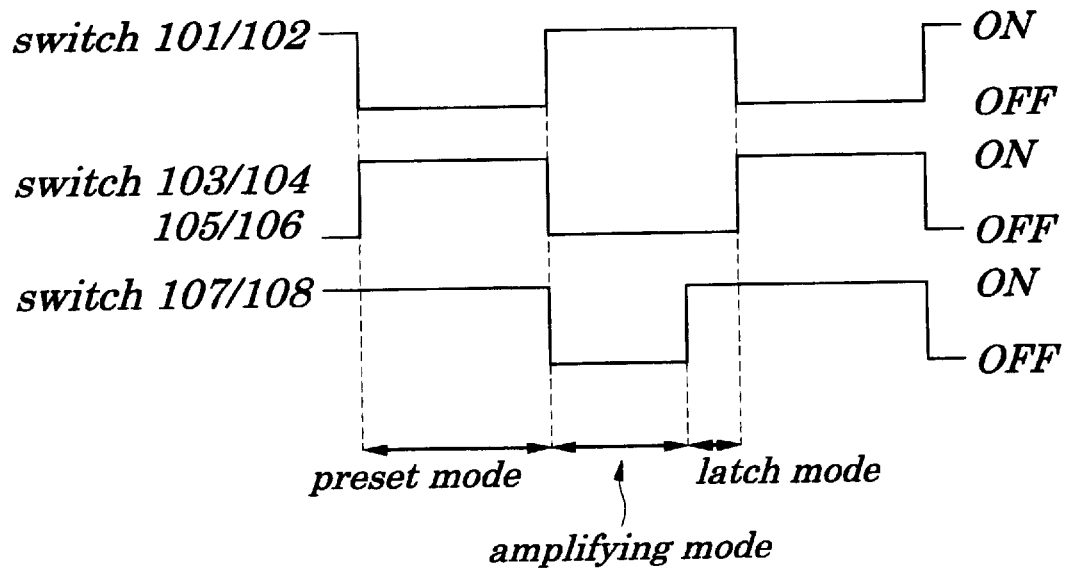
FIG. 10 explanatorily shows the operation timing of the conventional voltage comparing circuit shown in FIG. 9.

FIG. 8 is a schematic circuit diagram for showing an internal circuit arrangement of the voltage comparing circuit according to the fourth embodiment of the present invention.

As indicated in FIG. 8, the fourth voltage comparing circuit is mainly arranged by a switch 21, another switch 22, another switch 25, another switch 26, another switch 27, another switch 28, another switch 29, a capacitor 30, another capacitor 31, an inverter 32, another inverter 33, another capacitor 34, another capacitor 35, and a current source circuit 36.

In this fourth voltage comparing circuit, the switch 21 is turned ON/OFF between voltage $V_I$ of an analog input signal and one terminal of the capacitor 30. The switch 22 is turned ON/OFF between a voltage $V_R$ and one terminal of the capacitor 31. The switch 25 is turned ON/OFF between an input terminal of the inverter 22 and an output terminal thereof. The switch 26 is turned ON/OFF between an input terminal of the inverter 33 and an output terminal thereof. The switch 27 is turned ON/OFF via the capacitor 35 between an input terminal of the inverter 32 and an output terminal of the inverter 33. The switch 28 is turned ON/OFF via the capacitor 34 between an input terminal of the inverter 33 and an output terminal of the inverter 32. A switch 29 is turned ON/OFF between one terminal of the capacitor 30 and one terminal of the capacitor 31. As the inverter 32, FIG. 8 shows such an arrangement that a P-channel transistor $T_{11}$ is connected in series to an N-channel transistor $T_{12}$. Similarly, as the inverter 33, FIG. 8 represents such an arrangement that a P-channel transistor $T_{13}$ is connected in series to an N-channel transistor $T_{14}$. The constant current circuit 36 is constructed of a P-channel transistor $T_{15}$. Since a constant voltage $E_B$ is applied as a bias voltage to this constant current circuit 36, power supply currents lower than, or equal to a predetermined value may be supplied to both the inverters 32 and 33 by this constant current circuit 16.

Comparing Operation By Fourth Voltage Comparing Circuit

Referring to FIG. 8, comparing operations of this fourth voltage comparing circuit will be explained. It should be understood that operations of the circuit portions arranged by the switches 21, 22, 25 to 29, the capacitors 30/31, the inverters 32/33, and the capacitors 34/35 in the fourth voltage comparing circuit shown in FIG. 8 are similar to those of the third voltage comparing circuit indicated in FIG. 5.

Moreover, in the fourth voltage comparing circuit of FIG. 8, since the constant current circuit 36 is interposed between two sets of the inverters 32/33 and the power supply $V_{DD}$, which constitute the voltage comparing circuit, a maximum current flowing through the two inverters 32 and 33 becomes substantially constant irrespective of the power supply voltage. Also, since this constant current circuit 36 is additionally provided in the fourth voltage comparing circuit of FIG. 8, there is substantially no change in the currents consumed in the inverters 32 and 33 even when the power supply voltage is varied.

As previously described in detail, in accordance with the fourth voltage comparing circuit, since a total number of circuit elements is small by which this fourth voltage comparing circuit is arranged, the resultant voltage comparing circuit can be made compact, and also can be operated under low power consumption. Furthermore, since the offset voltages of two sets of inverters have no relationship with the judgement result, the channel lengths of the transistors can be shortened. As a result, the highspeed voltage comparing operation can be achieved. Also, in this fourth voltage comparing circuit, the sampling timing of the input voltages can be correctly and periodically determined, so that the precision of the input signal comparing process operation can be improved. In addition, since no current source circuit capable of performing the in-phase mode suppressing operation is longer required, this fourth voltage comparing circuit can be operated under low power supply voltages. Moreover, the entire circuit scale and the circuit board area of this fourth voltage comparing circuit can be reduced.

Moreover, in accordance with the fourth voltage comparing circuit, since the constant current circuit is additionally provided with the power supply of the two inverters which constitute this voltage comparing circuit, even when the power supply voltage is varied, there is a very small change in the consumed current.

While the present invention has been described in detail with reference to drawings, the present invention is not apparently limited to these concrete circuit arrangements, but may be modified, changed, or substituted without departing from the technical scope and spirit of the present invention. For instance, the sampling timing of the input voltage is preferably determined in the end of sampling mode in such a manner that firstly, either the switches 7/8 or the switches 27/28 are turned OFF, immediately thereafter, either the switches 5/6 or the switches 25/26 are turned OFF, and subsequently, either the switches 1/2 or the switch 21 is turned OFF. This reason is given as follows. When either the switches 1/2 or the switch 21 is firstly turned OFF, since the rising time of the pulse for driving the switches is not equal to 0, the off timing of the switches is changed in response to the amplitude of the input signal voltage. To the contrary, when either the switches 5/6 or the switches 25/26 are firstly turned OFF, since both sides of either the switches 5/6 or the switches 25/26 correspond to the virtual ground point, there is no change in the voltage. Furthermore, when either the switches 5/6 or the switches 25/26 are turned ON, the electron charges stored in either the capacitors 10/11 or the capacitors 30/31 are not varied even when the input voltage is changed. As a consequence, the sampling timing can be precisely determined. Furthermore, if either the switches 7/8 or the switches 27/28 remain under OFF states when either the switches 5/6 or the switches 25/26 are turned OFF, then either the inverters 12/13 or the inverters 32/33 may start the flip-flop operations thereof. However, the following condition is now effective. That is, the state may be determined based on the parasitic effect after the input signal is offsetcanceled. As a consequence, in order to avoid an occurrence of such a condition, either the switches 7/8 or the switches 27/28 must be turned OFF before either the switches 25/26 are turned OFF. In this case, since the path used to store the offset voltage is formed in either the capacitors 14/15 or the capacitors 34/35, it is not preferable that either the switches 7/8 or the switches 27/28 are turned OFF in the earlier stage. On the other hand, when either the switches 5/6 or the switches 25/26 and also the switches 7/8 or the switches 27/28 are turned OFF at the same time, this OFF-switching operation is not preferable, because there is possibility that a very small difference of the switch field-through between the two inverters is produced. As a consequence, it is desirable to turn OFF either the switches 5/6 or the switches 25/26 immediately after either the switches 7/8 or the switches 27/28 are turned OFF.

In addition, it is also desirable to turn OFF either the switches 3/4 or the switch 29 before the latch mode is ended. This reason is given as follows. That is, in the latch mode, after the flip-flop operation is commenced, not only either the switches 3/4 or the switch 29 need not be maintained under ON states, but also the load with respect to the forward feedback effect is increased. Therefore, the state decision as the flip-flop would be delayed.

As previously described in detail, in accordance with the voltage comparing circuits, according to the present invention, since a total number of circuit elements is small by which these voltage comparing circuits are arranged, the inventive voltage comparing circuits can be made compact, and also can be operated under low power consumption. Furthermore, since the offset voltages of two sets of inverters have no relationship with the judgement result, the channel lengths of the transistors can be shortened. As a result, the highspeed voltage comparing operation can be achieved. Also, in these voltage comparing circuits, the sampling timing of the input voltages can be correctly and periodically determined, so that the precision of the input signal comparing process operation can be improved. In addition, since no current source circuit capable of performing the in-phase mode suppressing operation is longer required, the inventive voltage comparing circuits can be operated under low power supply voltages. Moreover, the entire circuit scale and the circuit board area of this voltage comparing circuit can be reduced.

Moreover, in accordance with another voltage comparing circuit of the present invention, since the constant current circuit is additionally provided with the power supply of the two inverters which constitute this voltage comparing circuit, even when the power supply voltage is varied, there is a very small change in the consumed current.

It is thus apparent that the present invention is not limited to the above embodiments but may be changed and modified without departing from the scope and spirit of the invention.

Finally, the present application claims the priority of Japanese Patent Application No. Hei10-047598 filed on Feb. 27, 1998, which is herein incorporated by reference.

What is claimed is:

1. A voltage comparing circuit comprising:
    a first switch turned ON/OFF between a plus-sided voltage of an analog input signal and one terminal of a first capacitor;
    a second switch turned ON/OFF between a minus-sided voltage of the analog input signal and one terminal of a second capacitor;
    a third switch turned ON/OFF between a plus-sided voltage of a reference voltage and said one terminal of the first capacitor;
    a fourth switch turned ON/OFF between a minus-sided voltage of the reference voltage and said one terminal of the second capacitor;
    a first inverter connected between an input terminal thereof and the other terminal of said first capacitor;
    a second inverter connected between an input terminal thereof and the other terminal of said second capacitor;
    a fifth switch turned ON/OFF between the input terminal of the first inverter and an output terminal thereof;
    a sixth switch turned ON/OFF between the input terminal of said second inverter and an output terminal thereof;
    a seventh switch turned ON/OFF via a third capacitor between the input terminal of the first inverter and the output terminal of the second inverter; and
    an eighth switch turned ON/OFF via a fourth capacitor between the input terminal of the second inverter and the output terminal of the first inverter; wherein:
        said first, second, fifth, sixth, seventh, and eighth switches are turned ON whereas said third and fourth switches are turned OFF in a first operation mode;
        said third and fourth switches are turned ON whereas said first, second, fifth, sixth, seventh, and eighth switches are turned OFF in a second operation mode subsequent to said first operation mode; and
        said third, fourth, seventh, and eighth switches are turned ON whereas said first, second, fifth, and sixth switches are turned OFF in a third operation mode subsequent to said second operation mode, whereby a series of said switching operations is repeatedly carried out so as to compare the voltage of said analog input signal with said reference voltage.

2. A voltage comparing circuit according to claim 1, further comprising:
    a constant current circuit interposed between power supply input terminals of said first and second inverters, and a power supply.

3. A voltage comparing circuit according to claim 1 wherein:
    in an end stage of said first operation mode, both said fifth switch and said sixth switch are turned OFF immediately after both said seventh switch and said eighth switch are turned OFF, and thereafter both said first switch and said second switch are turned OFF.

4. A voltage comparing circuit according to claim 2 wherein:
    in an end stage of said first operation mode, both said fifth switch and said sixth switch are turned OFF immediately after both said seventh switch and said eighth switch are turned OFF, and thereafter both said first switch and said second switch are turned OFF.

5. A voltage comparing circuit according to claim 1 wherein:
    both said third switch and said fourth switch are turned OFF before said third operation mode is accomplished.

6. A voltage comparing circuit according to claim 2 wherein:
    both said third switch and said fourth switch are turned OFF before said third operation mode is accomplished.

7. A voltage comparing circuit according to claim 3 wherein:
    both said third switch and said fourth switch are turned OFF before said third operation mode is accomplished.

8. A voltage comparing circuit according to claim 1 wherein:
    said first inverter is arranged by series-connecting a first P-channel transistor to a first N-channel transistor; and said second inverter is arranged by series-connecting a second P-channel transistor to a second N-channel transistor.

9. A voltage comparing circuit according to claim 2 wherein:
said first inverter is arranged by series-connecting a first P-channel transistor to a first N-channel transistor; and
said second inverter is arranged by series-connecting a second P-channel transistor to a second n-channel transistor.

10. A voltage comparing circuit according to claim 9 wherein:
said constant current circuit is arranged by a third P-channel transistor.

11. A voltage comparing circuit according to claim 8 wherein:
a channel length of each of said first and second P-channel transistors and also of said first and second N-channel transistors is selected to be approximately 0.35 µm so as to obtain voltage comparing precision of 8 bits.

12. A voltage comparing circuit according to claim 9 wherein:
a channel length of each of said first and second P-channel transistors and also of said first and second N-channel transistors is selected to be approximately 0.35 µm so as to obtain voltage comparing precision of 8 bits.

13. A voltage comparing circuit according to claim 1 wherein:
a balance type voltage comparing circuit is constituted by employing said first to eight switches, said first and second inverters, and said first to fourth capacitors; and
both said first and second inverters are operable as a flip-flop circuit.

14. A voltage comparing circuit according to claim 2 wherein:
a balance type voltage comparing circuit is constituted by employing said first to eight switches, said first and second inverters, and said first to fourth capacitors; and
both said first and second inverters are operable as a flip-flop circuit.

15. A voltage comparing circuit comprising:
a first switch turned ON/OFF between an analog input signal and one terminal of a first capacitor;
a second switch turned ON/OFF between a reference voltage and one terminal of a second capacitor;
a third switch turned ON/OFF between said one terminal of the first capacitor and said one terminal of the second capacitor;
a first inverter connected between an input terminal thereof and the other terminal of said first capacitor;
a second inverter connected between an input terminal thereof and the other terminal of said second capacitor;
a fourth switch turned ON/OFF between the input terminal of the first inverter and an output terminal thereof;
a fifth switch turned ON/OFF between the input terminal of said second inverter and an output terminal thereof;
a sixth switch turned ON/OFF via a third capacitor between the input terminal of the first inverter and the output terminal of the second inverter; and
a seventh switch turned ON/OFF via a fourth capacitor between the input terminal of the second inverter and the output terminal of the first inverter; wherein:
said first, second, fourth, fifth, sixth, and seventh switches are turned ON whereas said third switch is turned OFF in a first operation mode;

said third switch is turned ON whereas said first, second, fourth, fifth, sixth, and seventh switches are turned OFF in a second operation mode subsequent to said first operation mode; and
said third, sixth, and seventh switches are turned ON whereas said first, second, fourth, and fifth switches are turned OFF in a third operation mode subsequent to said second operation mode, whereby a series of said switching operations is repeatedly carried out so as to compare the voltage of said analog input signal with said reference voltage.

16. A voltage comparing circuit according to claim 15, further comprising:
a constant current circuit interposed between power supply input terminals of said first and second inverters, and a power supply.

17. A voltage comparing circuit according to claim 15 wherein;
in an end stage of said first operation mode, both said fourth switch and said fifth switch are turned OFF immediately after both said sixth switch and said seventh switch are turned OFF, and thereafter both said first switch and said second switch are turned OFF.

18. A voltage comparing circuit according to claim 16 wherein:
in an end stage of said first operation mode, both said fourth switch and said fifth switch are turned OFF immediately after both said sixth switch and said seventh switch are turned OFF, and thereafter both said first switch and said second switch are turned OFF.

19. A voltage comparing circuit according to claim 15 wherein:
said third switch is turned OFF before said third operation mode is accomplished.

20. A voltage comparing circuit according to claim 16 wherein:
said third switch is turned OFF before said third operation mode is accomplished.

21. A voltage comparing circuit according to claim 17 wherein:
said third switch is turned OFF before said third operation mode is accomplished.

22. A voltage comparing circuit according to claim 15 wherein:
said first inverter is arranged by series-connecting a first P-channel transistor to a first N-channel transistor; and
said second inverter is arranged by series-connecting a second P-channel transistor to a second N-channel transistor.

23. A voltage comparing circuit according to claim 16 wherein:
said first inverter is arranged by series-connecting a first P-channel transistor to a first N-channel transistor; and
said second inverter is arranged by series-connecting a second P-channel transistor to a second N-channel transistor.

24. A voltage comparing circuit according to claim 23 wherein:
said constant current circuit is arranged by a third P-channel transistor.

25. A voltage comparing circuit according to claim 22 wherein:
a channel length of each of said first and second P-channel transistors and also of said first and second N-channel transistors is selected to be approximately 0.35 µm so as to obtain voltage comparing precision of 8 bits.

26. A voltage comparing circuit according to claim 23 wherein:
a channel length of each of said first and second P-channel transistors and also of said first and second N-channel transistors is selected to be approximately 0.35 μm so as to obtain voltage comparing precision of 8 bits.

27. A voltage comparing circuit according to claim 15 wherein:
a single-ended type voltage comparing circuit is constituted by employing said first to seventh switches, said first and second inverters, and said first to fourth capacitors; and
both said first and second inverters are operable as a flip-flop circuit.

28. A voltage comparing circuit according to claim 16 wherein:
a single-ended type voltage comparing circuit is constituted by employing said first to seventh switches, said fist and second inverters, and said first to fourth capacitors; and
both said fist and second inverters are operable as a flip-flop circuit.

29. A voltage comparing method comprising:
a first step for executing a first operation mode in such a manner that a first difference voltage between a plus-sided voltage of an analog input signal and a logical threshold voltage of a first inverter is stored in a first capacitor, and a second difference voltage between a minus-sided of said analog input signal and a logical threshold voltage of a second inverter is stored in a second capacitor, and also a third difference voltage between said logical threshold voltage of the first inverter and said logical threshold voltage of the second inverter is stored in both a third capacitor and a fourth capacitor;
a second step for executing a second operation mode in such a manner that a fourth difference voltage between said plus-sided voltage of the analog input signal and a plus-sided voltage of a reference voltage is amplified by a first inverter, and also a fourth difference voltage between said minus-sided voltage of the analog input signal and a minus-sided voltage of the reference voltage is amplified by a second inverter; and
a third step for executing a third operation step in such a manner that both said first inverter and said second inverter are operated as a flip-flop circuit; whereby
said first to third steps are repeatedly carried out so as to compare the voltage of said analog input signal with said reference voltage.

30. A voltage comparing method comprising:
a first step for executing a first operation mode in such a manner that a first difference voltage between a voltage of an analog input signal and a logical threshold voltage of a first inverter is stored in a first capacitor, and a second difference voltage between a reference voltage and a logical threshold voltage of a second inverter is stored in a second capacitor, and also a third difference voltage between said logical threshold voltage of the first inverter and said logical threshold voltage of the second inverter is stored in both a third capacitor and a fourth capacitor;
a second step for executing a second operation mode in such a manner that both said first difference voltage between said analog input signal voltage and said logical threshold voltage of the first inverter, and said second difference voltage between said reference voltage and said logical threshold voltage of the second inverter are redistributed into said first and second capacitors, and further, potential variations appearing on the output sides of said first and second capacitors are amplified by said first inverter and said second inverter, respectively; and
a third step for executing a third operation step in such a manner that both said first inverter and said second inverter are operated as a flip-flop circuit; whereby
said first to third steps are repeatedly carried out so as to compare the voltage of said analog input signal with said reference voltage.

* * * * *